United States Patent
Kwon et al.

(10) Patent No.: US 6,879,527 B2
(45) Date of Patent: Apr. 12, 2005

(54) SEMICONDUCTOR MEMORY DEVICE WITH STRUCTURE PROVIDING INCREASED OPERATING SPEED

(75) Inventors: Kee-Won Kwon, Kyungki-do (KR); Youn-Cheol Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/614,013

(22) Filed: Jul. 8, 2003

(65) Prior Publication Data

US 2004/0008547 A1 Jan. 15, 2004

(30) Foreign Application Priority Data

Jul. 8, 2002 (KR) ................................ 10-2002-0039427

(51) Int. Cl.$^7$ ................................................. G11C 7/00
(52) U.S. Cl. .............. 365/193; 365/230.03; 365/189.02
(58) Field of Search ........................... 365/193, 230.03, 365/189.02, 194, 200, 191, 230.02, 189.12

(56) References Cited

U.S. PATENT DOCUMENTS

| | | | | | |
|---|---|---|---|---|---|
| 5,349,560 A | * | 9/1994 | Suh et al. | .................... | 365/203 |
| 5,367,495 A | * | 11/1994 | Ishikawa | ..................... | 365/239 |
| 5,485,424 A | * | 1/1996 | Kawamura | ................... | 365/200 |
| 5,950,223 A | * | 9/1999 | Chiang et al. | .............. | 711/105 |
| 5,959,936 A | * | 9/1999 | Seo et al. | .................... | 365/233 |
| 2002/0060938 A1 | * | 5/2002 | Song et al. | ................. | 365/200 |
| 2003/0103394 A1 | * | 6/2003 | Koshikawa | ................. | 365/200 |

* cited by examiner

Primary Examiner—Michael S. Lebentritt
Assistant Examiner—Dang Nguyen
(74) Attorney, Agent, or Firm—Volentine, Francos & Whitt, PLLC

(57) ABSTRACT

A semiconductor memory device includes a plurality of memory array blocks including predetermined numbers of memory cells, the memory array blocks being arranged in the row direction; a RAS chain being aligned at a side of the plurality of memory array blocks in the row direction, the RAS chain for selecting and activating a particular word line; a CAS chain being aligned at the other side of the plurality of memory array blocks in the column direction, the CAS chain for amplifying N bits of data from the plurality of memory array blocks and outputting the result to an input/output (IO) line, wherein N is a natural number more than 2; and a data converter for continuously outputting the N bits of data input via the IO line from a memory array block nearest to the RAS chain to a memory array block farthest from the RAS chain.

11 Claims, 8 Drawing Sheets

SEMICONDUCTOR MEMORY DEVICE WITH STRUCTURE PROVIDING INCREASED OPERATING SPEED

CROSS REFERENCES TO RELATED APPLICATIONS

This application claims priority under 35 U.S.C. § 119 from Korean Patent Application No. 2002-39427, filed on Jul. 8, 2002, the contents of which are hereby incorporated by reference in their entirety for all purposes as if fully set forth herein.

BACKGROUND AND SUMMARY

1. Technical Field

The present invention relates to a semiconductor memory device, and more particularly, to a semiconductor memory device with a structure which increases the operating speed thereof.

2. Description

A semiconductor memory device is a kind of semiconductor device in which information is read from or written to memory cells. In general, a plurality of memory cells for storage of information are included in a semiconductor memory device.

Such a semiconductor memory device, however, has a problem that a plurality of memory cells are widely distributed in the semiconductor memory device and, thus, the shortest access time depends on the position of each memory cell.

For this reason, a semiconductor memory device is set to operate with respect to a rate limiting path, in which a control signal is generated to have the latest timing, in order to input or output information to or from the respective memory cells without error. In general, reading/writing operations performed through the rate limiting path are delayed by 2–3 ns in comparison with those performed through the shortest path.

The rate limiting path is determined mainly in consideration of a delay in transmission of a Row Address Strobe (RAS) control signal, an inconstant transmission speed of a column path, skew of input and output (IO) paths, and so on. Among the above factors, the delay in transmission of a RAS control signal is the most important factor that is considered in determining the rate-limiting path. Skew indicates the distribution of deviation between signals that are generated differently according to the layout of an internal circuit or the number of inverters in a semiconductor memory device.

FIG. 1 is a diagram of IO paths of data, which are determined according to the positions of array blocks, in a general memory cell array. Referring to FIG. 1, a plurality of memory cell array blocks 11 are aligned in a matrix of rows and columns. The memory cell array blocks 11 are located at both sides of a RAS chain 12. Two Column Address Strobe (CAS) chains 13 are arranged in the column direction below the plurality of memory cell array blocks 11.

As shown in FIG. 1, a path 14 of the memory cell array block 11 adjacent to the RAS chain 12 is shorter than a path 15 of the memory cell array block 111 which is further away from the RAS chain 12.

The diagram of FIG. 1 reveals that an increase in the size of a semiconductor memory device results in an increase in skew, i.e., deviation of a signal, between a short path and a long path due to a difference in the layout of an internal circuit.

Accordingly, a semiconductor memory device shown in FIGS. 2A and 2B is suggested to solve the skew. In detail, FIG. 2A is a view of a structure of one conventional semiconductor memory device, and FIG. 2B is a view of a structure of another conventional semiconductor memory device. The semiconductor memory device of FIG. 2A has a structure in which a RAS control signal can be transmitted faster by an increase in the number of RAS chains 12, whereas the semiconductor memory device of FIG. 2B has a structure in which one RAS chain 12 is positioned between two groups of memory cell array blocks and one edge driver 16 is arranged at one side of each of the two groups of memory cell array blocks.

Like the semiconductor memory device of FIG. 2A, the semiconductor memory device of FIG. 2B also has a structure in which an RAS control signal can be transmitted faster. The edge driver 16 receives a control signal from the RAS chain 12 and activates the respective memory cells.

However, although a semiconductor memory device having a structure shown in FIG. 2A or 2B is advantageous in that skew is reduced due to an increase in the speed of transmission of the RAS control signal, the additional RAS chain(s) or the edge drivers take up a large amount of space of the semiconductor memory device.

FIG. 3 is a timing chart illustrating signals that are related to data output from a general semiconductor memory device. In detail, FIG. 3 shows the types of skew that occur in the respective control signals passing through various paths of a memory cell array block 11. Referring to FIG. 3, the bold lines indicate signals passing through the shortest path and the fine lines indicate signals passing through a longer path.

FIG. 3 reveals that the RAS control signal is transmitted from a path nearest to a RAS chain to a path farthest from the RAS chain. Also, final output data DQ is output at an instant of time when data RD is output from the longest path of a memory cell array block.

In FIG. 3, only skews in a word line WL and a bit line sense enable BLSE, in which output of data is delayed for a long time, are considered.

When the shortest path is selected, the final output data DQ is in fact output not in synchronization with a signal output from the shortest path, but in synchronization with a signal output from the longest path. A time difference between a signal output from the shortest path and a signal output from the longest path is due to skew and is about 1–2 nsec.

FIG. 4 is a diagram illustrating a structure of a conventional semiconductor memory device. The conventional semiconductor memory device of FIG. 4 includes a plurality of memory array blocks 21, a RAS chain 23, a CAS chain 24, and a plurality of multiplexers 25.

Each of the plurality of memory array blocks 21 includes a predetermined number of memory cells for storage of data. The RAS chain 23 is arranged at one side of the plurality of memory array blocks 21 in the row direction and outputs a RAS control signal for activating a word line of a memory cell.

The CAS chain 24 is arranged in the column direction at the bottom of the plurality of memory array blocks 21, and selects a bit line of a particular memory cell, amplifies data from the bit line, and outputs the amplified data.

The plurality of multiplexers 25 are connected to the plurality of memory array blocks 21, respectively. The plurality of multiplexers 25 pre-fetch 8-bit data from the plurality of memory array blocks 21 for speedy transmission of data. The pre-fetched data is converted into serial data DQ0 through DQ7 by the plurality of multiplexers 25.

The serial data DQ0 through DQ7 must be input or output in response to the same clock. Therefore, the data DQ7, which is first output from the memory array block 21, is in a stand-by mode until the data DQ0 is set up. The latency time of DQ7 depends on variations in factors such as the manufacturing temperature, process, and supplied voltage. Thus, the semiconductor memory device is designed such that the data DQ7 is output after a latency time that is longer than the skew.

Accordingly, a conventional semiconductor memory device is designed to receive or transmit data based on the longest path for data and has a reduced operating speed.

The present invention provides a semiconductor memory device with improved operating speed, in which data is input or output in synchronization with a signal input to or output from the shortest path.

According to one aspect of the present invention, there is provided a semiconductor memory device in which a plurality of memory cells are arranged in the form of a matrix in the row and column directions, the semiconductor memory device including a plurality of memory array blocks that each have predetermined numbers of memory cells and are arranged in the row direction; an RAS chain that is aligned at a first side of the plurality of memory array blocks in the row direction, and selects and activates a particular word line; a CAS chain that is aligned at the other side of the plurality of memory array blocks in the column direction and amplifies N bits of data from the plurality of memory array blocks and outputs the result to an input/output (IO) line (N is a natural number more than 2); and a data converter that continuously outputs the N bits of data input via the IO line from a memory array block nearest to the RAS chain to a memory array block farthest from the RAS chain.

According to another aspect of the present invention, there is also provided a semiconductor memory device in which a plurality of memory cells are arranged in the form of a matrix in the row and column directions, the semiconductor memory device including a plurality of memory array blocks that have predetermined numbers of memory cells and are arranged in the row direction; an RAS chain that is arranged at a first side of the plurality of memory array blocks in the row direction, and selects and activates a particular word line; a CAS chain that is arranged at the other side of the plurality of memory array blocks in the column direction, and amplifies N bits of data output from the plurality of memory array blocks and outputs the amplified N bits of data to an IO line, wherein N is a natural number more than 2; and a plurality of multiplexers that converts the N bits of data input via the IO line into serial data, and outputs the serial data. The respective memory array blocks are divided into predetermined numbers of memory sub-blocks, and the nearer a memory array block is to the RAS chain, the smaller the number of the memory sub-blocks of the memory array block.

BRIEF DESCRIPTION OF THE DRAWINGS

The above aspects and advantages of the present invention will become more apparent by describing in detail preferred embodiments thereof with reference to the attached drawings in which.

DETAILED DESCRIPTION

Figure 1:
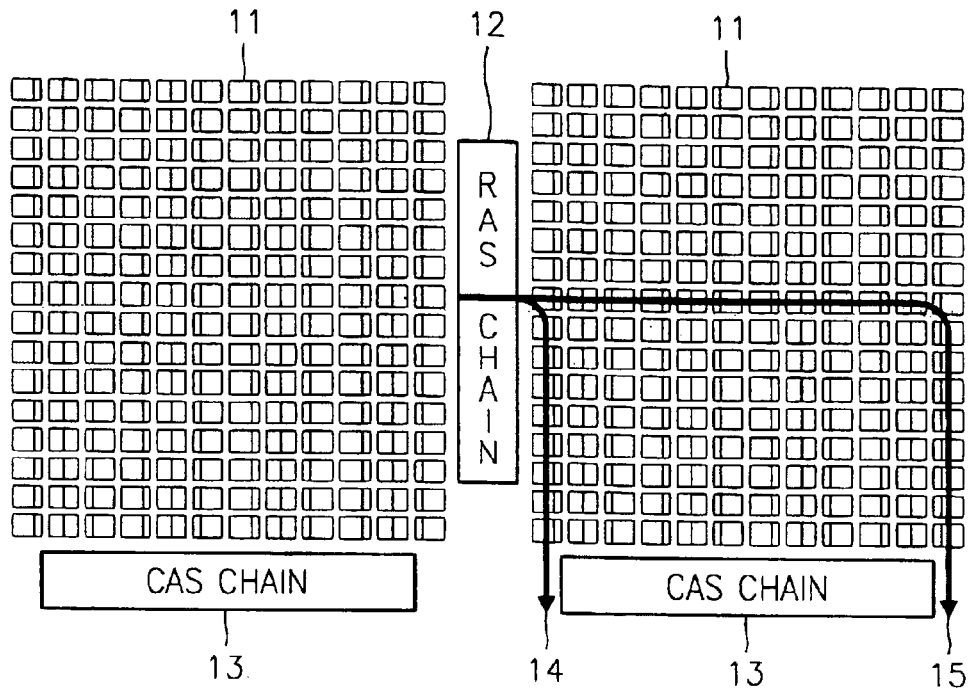
FIG. 1 is a diagram of input/output (IO) paths of data, which are determined according to the position of an array block, in a general memory cell array.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thicknesses of layers and regions are exaggerated for clarity. The same reference numerals in different drawings represent the same element, and thus their description will be omitted.

Figure 5:
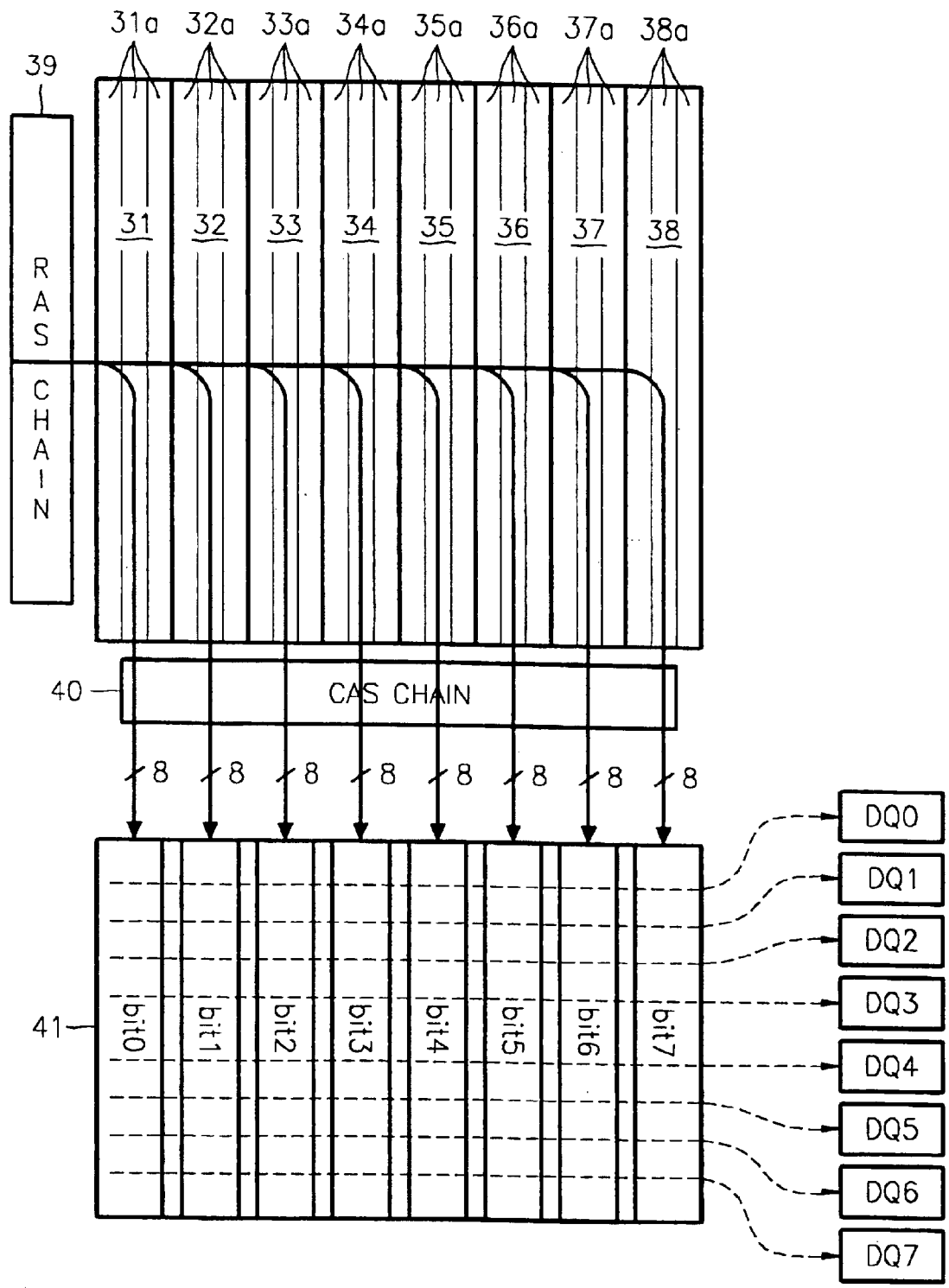
FIG. 5 is a diagram illustrating a first embodiment of a structure of a semiconductor memory device which has increased operating speed.

FIG. 5 is a diagram of a first embodiment of a semiconductor memory device having a structure which increases operating speed. Referring to FIG. 5, the semiconductor memory device according to a first embodiment includes first through eighth memory array blocks 31 through 38, a RAS chain 39, a CAS chain 40, and a data converter 41.

The respective first through eighth memory array blocks 31 through 38 include predetermined numbers of memory cells for storage of data. It is preferable that the respective first through eighth memory array blocks 31 through 38 include 1 K bits of memory cells per row. Also, the first through eighth memory array blocks are divided into three memory sub-blocks 31a through 38a, respectively. As a result, one word line activates 352 bits memory cells at once in the memory sub-blocks 31a through 38a.

FIG. 5 illustrates the division of one memory array block into three memory sub-blocks but the number of memory sub-blocks is not limited, i.e., the number of memory sub-blocks may be determined to be larger or smaller than three if necessary. Also, the semiconductor memory device according to the first embodiment is explained with respect to eight memory array blocks but the number of memory array blocks is not limited to eight.

The RAS chain 39 is placed at one side of the first through eighth memory array blocks 31 through 38 in the row direction and outputs a control signal for activating a word line of a memory cell. Although not shown in FIG. 5, the RAS chain 39 includes a row decoder, a logic circuit, and driving circuits.

The CAS chain 40 is positioned at the bottoms of the first through eighth memory array blocks 31 through 38 in the column direction, and selects a bit line of a particular memory cell, amplifies data of the bit line, and outputs the same. Although not shown in FIG. 5, the CAS chain 40 includes a column decoder and an amplifying circuit.

The data converter 41 is connected to the first through eighth memory array blocks 31 through 38 so as to prefetch 8 bits of data output from the first through eighth memory array blocks. The data converter 41 converts 8 bits of data output from the first memory array block 31 into a first bit bit0 of DQ0 through DQ7 and outputs the result. Also, the data converter 41 converts 8 bits of data output from the second memory array block 32 into a second bit bit1 of DQ0 through DQ7 and outputs the result. Likewise, data output from the third through eighth memory array blocks 33 through 38 is converted into a third bit bit2 through an eighth bit bit7 of DQ0 through DQ7 and output.

More specifically, 8 bits of data output from the first memory array block 31 is converted into DQ0 through DQ7 and output. Further, 8 bits of data output from the second memory array block 32 is converted into DQ0 through DQ7 and output. Likewise, bits of the data output from the third through eighth memory array blocks 33 through 38 are also increased by one bit and output as bit 2 through bit 7 of data DQ0 through DQ7, and output, respectively.

Therefore, 8 bits of data output from the first memory array block 31, which is the shortest path, is in synchronization with the same clock signal and output to DQ0 through DQ7. Next, data is output from the second through eighth memory array blocks 32 through 38 to DQ0 through DQ7 in numerical order.

For instance, it is sufficient to output the next bit data bit1 in synchronization with a next clock signal after the output of the first bit of data bit0, and thus, output of a control signal from the RAS chain 39 may be delayed for a predetermined time. In currently used RAMBUS® dynamic random access memory (DRAM), an interval between the output of one bit and the output of the next bit is 1.25 nsec but a delay time between transmission of a control signal output from the RAS chain 39 to one memory array block and the next memory array block is just 50–500 psec. Thus, a considerable timing margin is caused.

In other words, data of a memory array block of a short path is output before output of data from a memory array block of a long path, and as a result, IO speed of data is increased.

Figure 2A:
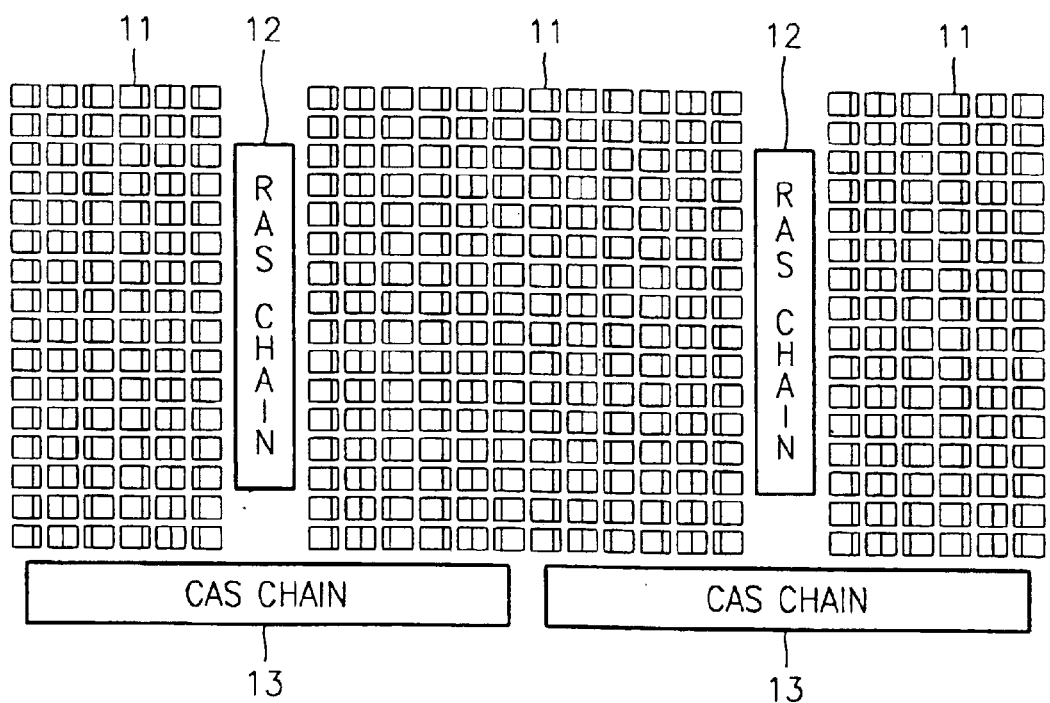
FIG. 2A is a view of a structure of a conventional semiconductor memory device.
Figure 2B:
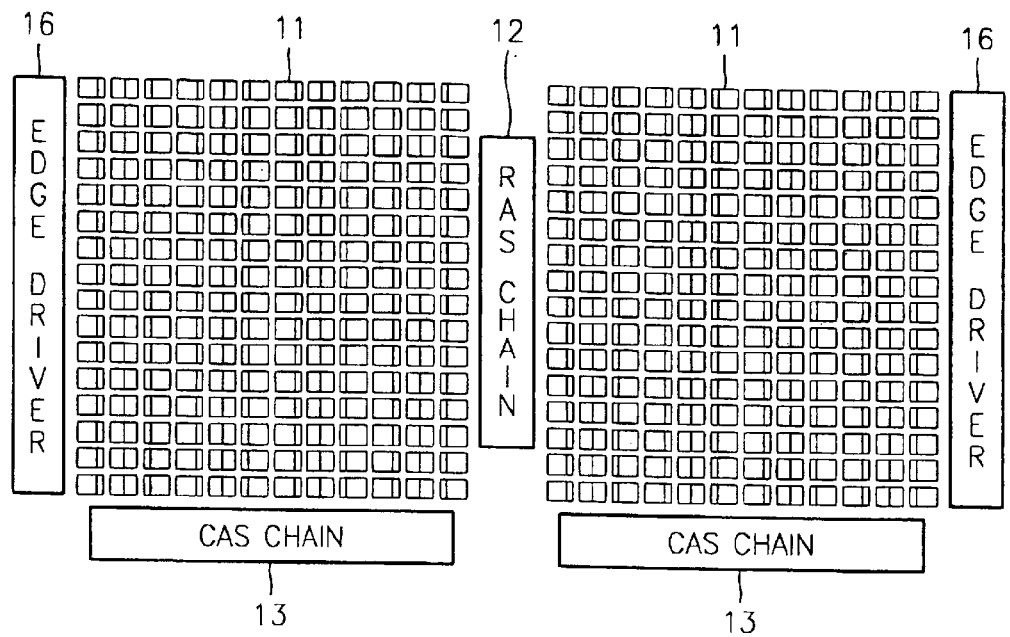
FIG. 2B is a view of a structure of another conventional semiconductor memory device.
Figure 3:
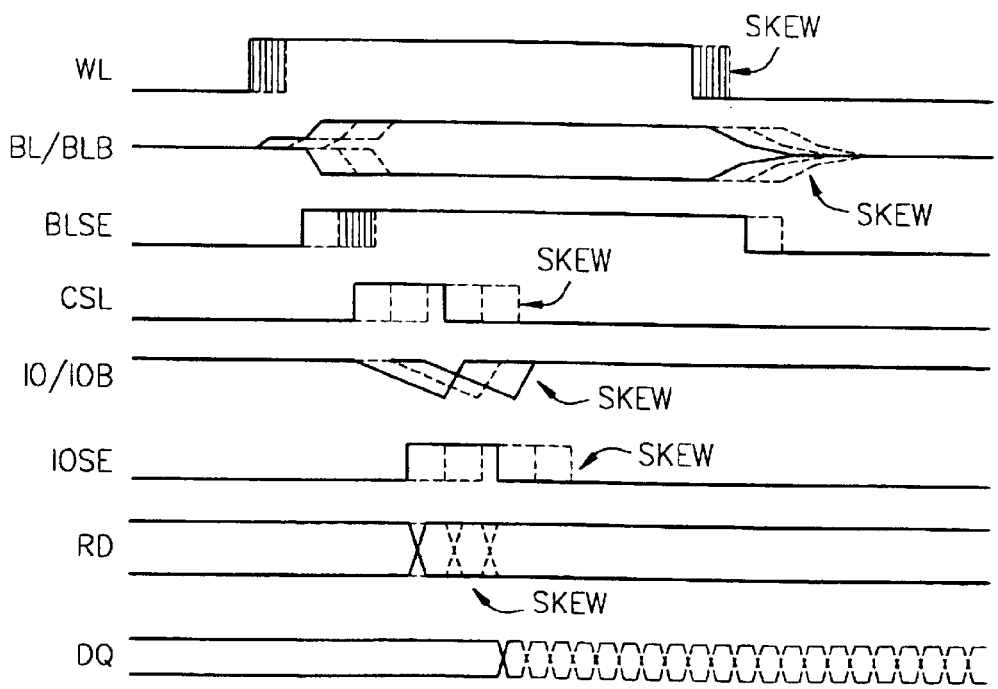
FIG. 3 is a timing chart illustrating signals that are related to data output from a general semiconductor memory device.
Figure 4:
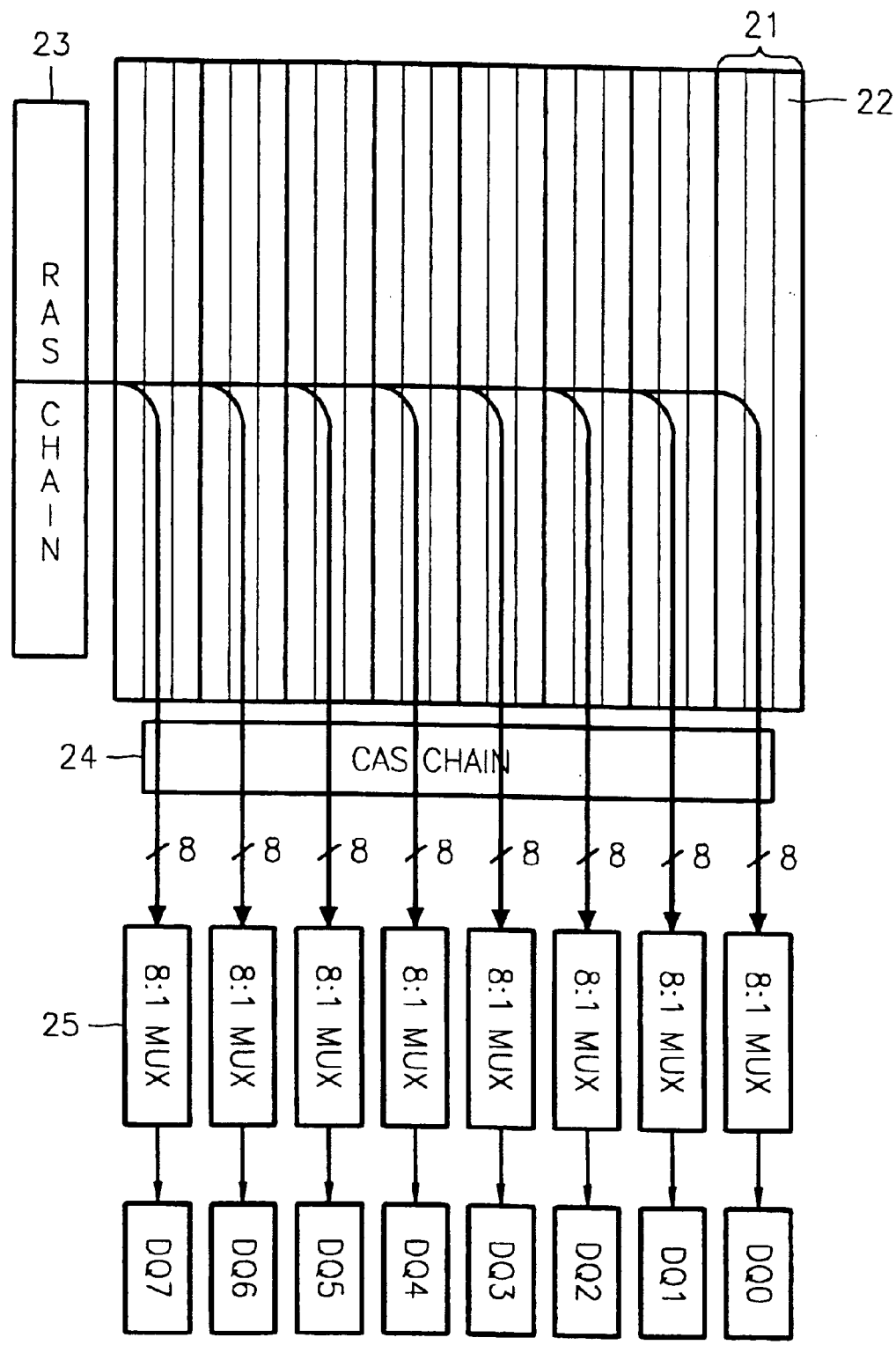
FIG. 4 is a diagram illustrating a structure of a conventional semiconductor memory device.

In conclusion, the operating speed of a semiconductor memory device, shown in FIG. 5, according to the first embodiment can be increased by using the above timing margin of the RAS chain 39. Therefore, an additional RAS chain or an edge driver is not required for the activation of a word line of a memory cell unlike in a conventional semiconductor memory device as shown in FIG. 2A, thereby remarkably reducing the size of a semiconductor chip.

Despite this advantage, the speed of inputting/outputting data of the semiconductor memory device of FIG. 5 depends on access time of the shortest path. For this reason, the length of the shortest path must be shortened more to reduce access time. In this connection, FIG. 6 shows a semiconductor memory device, according to a second embodiment, having a structure which increases the operating speed thereof.

Figure 6:
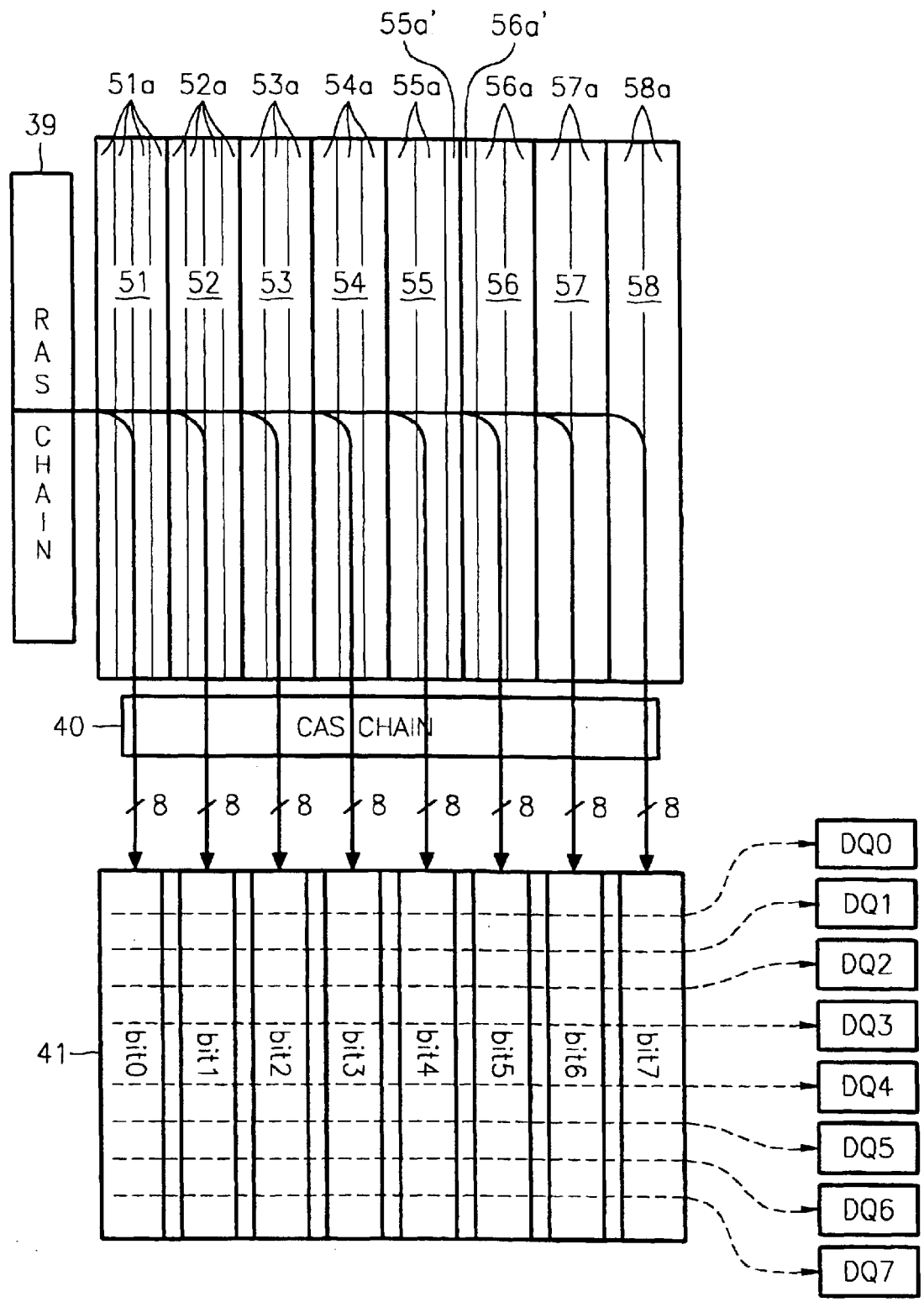
FIG. 6 is a diagram illustrating a second embodiment of a structure of a semiconductor memory device which has increased operating speed.

The structure and operation of the semiconductor memory device of FIG. 6 according to the second embodiment are the same as those of the semiconductor memory device of FIG. 5 according to the first embodiment, and therefore, their description will be omitted.

However, there is one difference between these semiconductor memory devices, i.e., they are different from each other in terms of the number of memory sub-blocks of each memory array block.

More specifically, referring to FIG. 6, first and second memory array blocks 51 and 52 are divided into four memory sub-blocks 51a and four memory sub-blocks 52a, respectively, and include memory cells of 256 bits for one word line, respectively. Third and fourth memory array blocks 53 and 54 are divided into three memory sub-blocks 53a and three memory sub-blocks 54a, respectively, and include memory cells of 352 bits for one word line. A fifth memory array block 55 is divided into two and a half memory sub-blocks 55a . . . 55a', where 55a' is half the size of 55a, and includes memory cells of 412 bits for one word line. A sixth memory array block 56 is divided into two and a half memory sub-blocks 56a . . . 56a', where 56a' is half the size of 56a, and includes memory cells of 412 bits for one word line. Also, seventh and eighth memory array blocks 57 and 58 are divided into two memory sub-blocks 57a and two memory sub-blocks 58a and include memory cells of 512 bits for one word line.

In conclusion, the nearer a memory array block is to a RAS chain 39, i.e., the shorter a path of a memory array block, the greater the number of memory sub-blocks. As a result, IO speed of the data increases. Conversely, the farther a memory array block is from the RAS chain 39, i.e., the longer a path of a memory array block, the smaller the number of memory sub-blocks. In this case, the IO speed of data decreases.

The reason why an increase in the number of memory sub-blocks results in an increase in the IO speed of data is because a reduction in the size of a memory sub-block results in a reduction in the number of memory cells connected to one word line. The smaller the number of memory cells connected to one word line, the faster the transmission of the RAS control signal. Also, an increase in the IO speed of data of the shortest path improves the operating speed of a semiconductor memory device.

Hereinafter, a comparison of the structures of the semiconductor memory devices of FIGS. 5 and 6 will be described. The semiconductor memory device of FIG. 5 includes the memory array blocks 31 through 38 that are each divided into three memory sub-blocks 31a through 38a, respectively. Each memory sub-block has a memory cell of 352 bits per word line. That is, a total of twenty-four memory sub-blocks are present in the semiconductor memory device of FIG. 5.

In contrast, the semiconductor memory device of FIG. 6 includes the memory array blocks 51 through 58 that are unequally divided into memory sub-blocks 51a through 58a, respectively. The respective memory sub-blocks 51a through 58a have memory cells of 256 bits, memory cells of 352 bits, memory cells of 412 bits, and memory cells of 512 bits. Therefore, a total of twenty-three memory sub-blocks are present in the semiconductor memory device of FIG. 6.

That is, the number of memory sub-blocks of the semiconductor memory device of FIG. 6 is smaller than the number of the memory sub-blocks of the semiconductor memory device of FIG. 5 by one block. Here, although not shown in FIG. 5, bit sense amplifiers or local drivers are present between the memory sub-blocks 31a–38a. Likewise, although not shown in FIG. 6, bit line sense amplifiers or local drivers are present between the memory sub-blocks 51a–58a. Consequently, when the number of memory sub-blocks decreases, the number of bit line sense amplifiers or local drivers present between the memory sub-blocks also decreases. Therefore, the semiconductor memory device of FIG. 6 is smaller than the semiconductor memory device of FIG. 5, and has a faster operating speed.

As mentioned above and illustrated in FIG. 6, the memory array blocks 51 through 58 are divided into memory sub-blocks 51a through 58a. However, there is no limit to the number of memory sub-blocks of each memory array block since the nearer a memory array block comes to the RAS chain 39 the more memory sub-blocks a memory array block has.

For instance, each of the first and second memory array blocks 51 and 52 may be divided into four memory sub-blocks and each of the other memory blocks, i.e., the third through eighth memory array blocks 53 through 58, may be divided into two memory sub-blocks. In this case, a total of twenty memory sub-blocks are present in the memory array blocks, so as to be three blocks less than the number of memory sub-blocks in the semiconductor memory device of FIG. 6. When the number of memory sub-blocks decreases, the number of bit line sense amplifiers or local drivers present between the memory sub-blocks decreases so that the area of the semiconductor memory device is reduced.

In the semiconductor memory device of FIG. 6, there is a considerable timing difference between the delay times of the data DQ0 through DQ7, and a delay time in the RAS control signal that is transmitted to each memory array block. Also, the delay time in the RAS control signal changes according to temperature, manufacturing process, supplied voltage, and so on. Therefore, adjustment of the delay time in the RAS control signal is required to make the semiconductor memory device operate stably.

Figure 7:
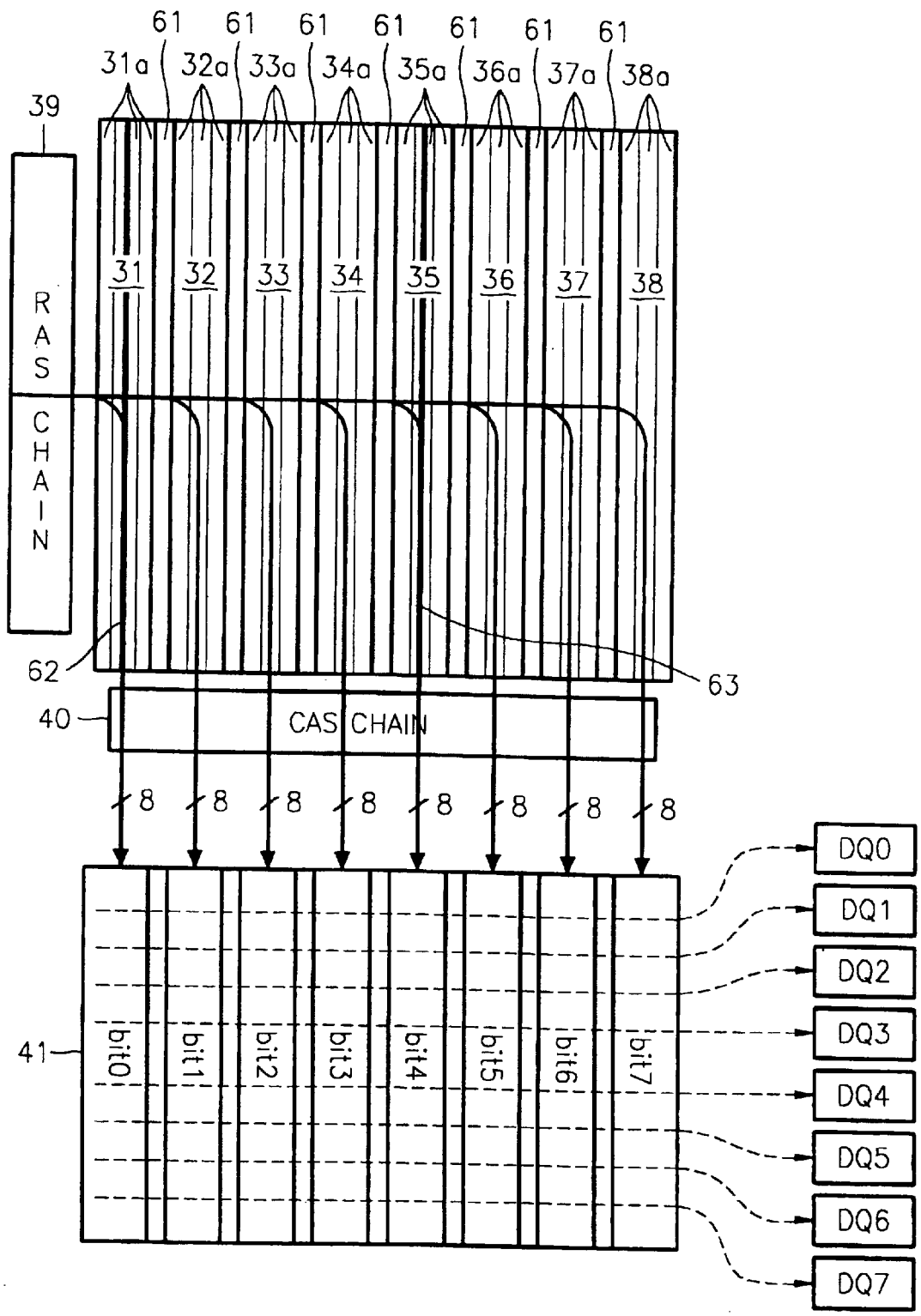
FIG. 7 is a diagram illustrating a third embodiment of a structure of a semiconductor memory device which has increased operating speed.

FIG. 7 is a diagram of a semiconductor memory device, according to a third embodiment, having a structure which increases the operating speed thereof. The structure and operations of the semiconductor memory device of FIG. 7 are almost the same as those of the semiconductor memory device of FIG. 5 according to the first embodiment. Thus, their descriptions will be omitted.

The semiconductor memory device of FIG. 7 is different from the semiconductor memory device of FIG. 5 in two aspects. First, the semiconductor memory device of FIG. 7 further includes one repeater 61 between two memory array blocks. The repeater 61 delays a RAS control signal output from the RAS chain 39 and outputs the result. Here, the repeater 61 may be replaced with an inverter. In detail, the repeater 61 sequentially transmits the RAS control signal to first through eighth memory array blocks 31 through 38 so as to arbitrarily change a delay time in the input/output of data.

Also, the RAS control signal is sequentially transmitted to the respective memory array blocks at predetermined intervals of time, and, thus, the amount of the peak current of the power supplied to each memory array block is reduced to one eighth, thereby preventing or reducing Vss (supply voltage) noise.

Secondly, the first and fifth memory array blocks 31 and 35 further include first and second redundancy memory array blocks 62 and 63.

In the semiconductor memory device of FIG. 7, the arrangement of the redundancy memory cell array is very important. If a memory cell array has a defective memory cell, the defective memory cell is replaced with a redundancy memory cell. Here, much attention must be paid to appropriately arrange the redundancy memory cell array so that the access time of the redundancy memory cell is not slower than that of the defective memory cell. Also, a redundancy memory cell array used to repair a memory cell array of the shortest path must be placed along the shortest path.

The first redundancy memory array block 62 operates when one of the first through fourth memory array blocks 31 through 34 is damaged, and the second redundancy memory array block 63 operates when one of the fifth through eighth memory array blocks 35 through 38 is damaged.

The semiconductor memory device of FIG. 7 is described with respect to the first and second redundancy memory array blocks 62 and 63 but the number of redundancy memory array blocks is not limited. Also, these redundancy memory array blocks 62 and 63 are applicable to both the semiconductor memory devices of FIGS. 5 and 6 according to the first and second embodiments.

Figure 8:
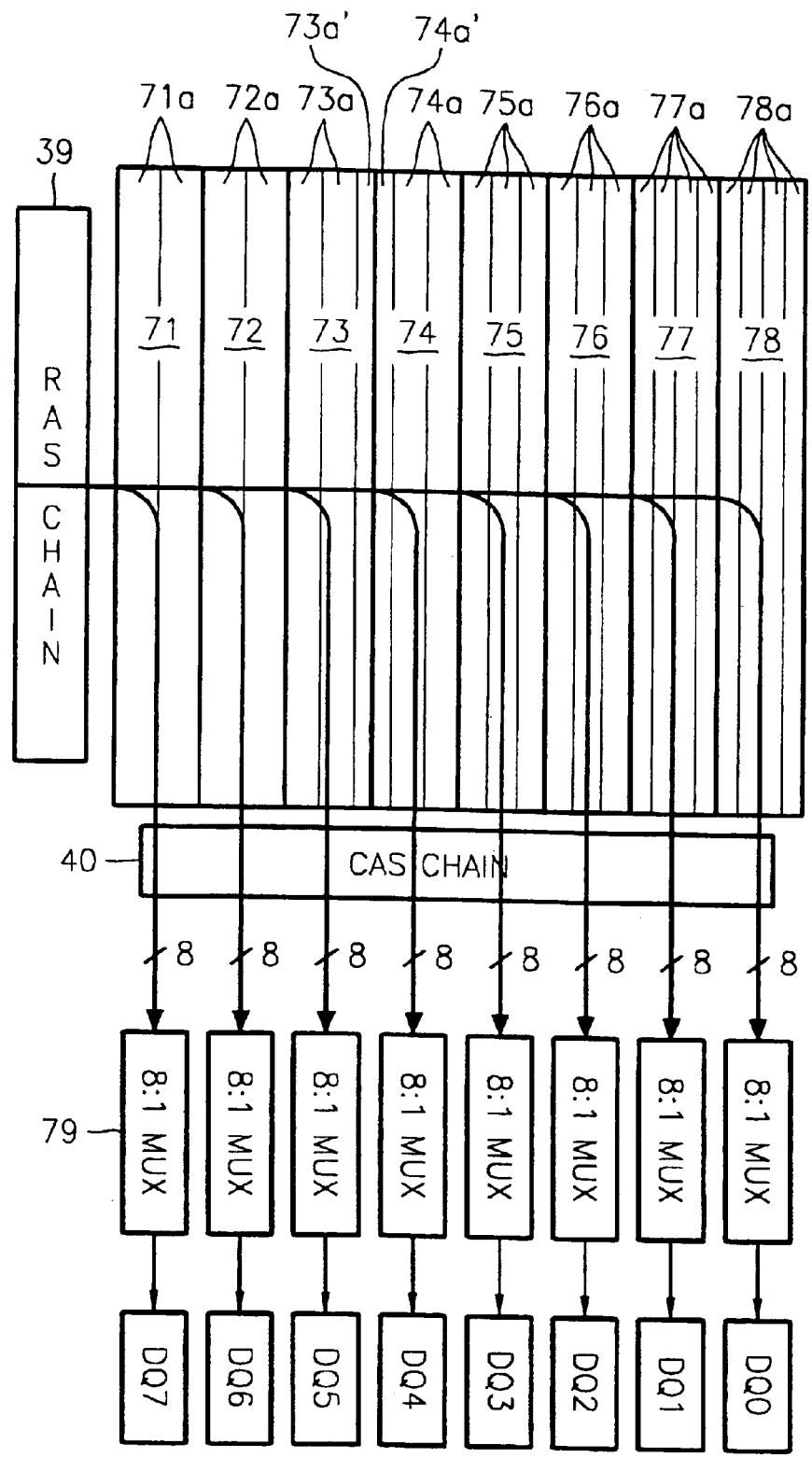
FIG. 8 is a diagram illustrating a fourth embodiment of a structure of a semiconductor memory device which has increased operating speed.

FIG. 8 is a diagram of a semiconductor memory device, according to a fourth embodiment, having a structure which increases the operating speed thereof. The semiconductor memory device includes first through eighth memory array blocks 71 through 78, a RAS chain 39, a CAS chain 40, and a plurality of multiplexers 79.

The structures and operations of the RAS chain 39 and the CAS chain 40 are the same as those of the RAS chain 39 and the CAS chain 40 according to the first embodiment. Therefore, their descriptions will be omitted here.

The respective first through eighth memory array blocks 71 through 78 include predetermined numbers of memory cells for storage of data. Preferably, each of the first through eighth memory array blocks 71 through 78 includes 1 K bits of memory cells per row.

The first memory array block 71 is divided into two memory sub-blocks 71a and the second memory array block 72 is divided into two memory sub-blocks 72a. Each of the memory sub-blocks 71a and 72a includes memory cells of 512 bits for one word line.

The third memory array block 73 is divided into two and a half memory sub-blocks 73a . . . 73a', where 73a' is half the size of 73a, and includes memory cells of 412 bits for one word line. The fourth memory array block 74 is divided into two and a half memory sub-blocks 74a . . . 74a', where 74a' is half the size of 73a, and includes memory cells of 412 bits for one word line. Also, the fifth memory array block 75 is divided into three memory sub-blocks 75a and the sixth memory array block 76 is divided into three memory sub-blocks 76a. Each of the memory sub-blocks 75a and 76a includes memory cells of 352 bits for one word line.

The seventh memory array block 77 is divided into four memory sub-blocks 77a and the eighth memory array block 78 is divided into four memory sub-blocks 78a. Each of the memory sub-blocks 77a and 78a includes memory cells of 256 bits for one word line.

In conclusion, the nearer a memory array block is to the RAS chain 39, i.e., the shorter a path of a memory array block, the smaller the number of memory sub-blocks. In this case, the IO speed of data decreases. Conversely, the farther a memory array block is to the RAS chain 39, i.e., the longer a path of a memory array block, the larger the number of memory sub-blocks. In this case, the IO speed of data increases.

If delay times in all of the RAS control signals are uniformly adjusted, the speed of the input/output of data to/from the respective memory array blocks can be almost the same, thereby reducing a latency time of the shortest path.

The plurality of multiplexers 79 are connected to the first through eighth memory array blocks 71 through 78, respectively, and prefetch 8 bits of data output from the first through eighth memory array blocks 71 through 78 for fast transmission of data. The prefetched data is converted into serial data DQ0 through DQ7 by the plurality of multiplexers 79, and output.

More specifically, 8 bits of data output from the first memory array block 71 is converted into DQ7<0> through DQ7<7> and output. Also, 8 bits of data output from the second memory array block 72 is converted into DQ6<0> through DQ6<7> and output. Similarly, 8 bits of data output from each of the third through eighth memory array blocks 73 through 78 are converted into DQ5<0> through DQ5<7>, and DQ0<0> through DQ0<7> and output.

Referring to FIG. 8, the farther a memory array block is from the RAS chain 39, the greater the number of memory sub-blocks of the memory array block. Therefore, input and output of data to and from the memory array blocks 71 through 78 can be made at a similar speed.

The data DQ0 through DQ7, which is to be input and output in synchronization with the same clock signal, is set up at a similar speed, and therefore, a latency time in the shortest path decreases.

Figure 9:
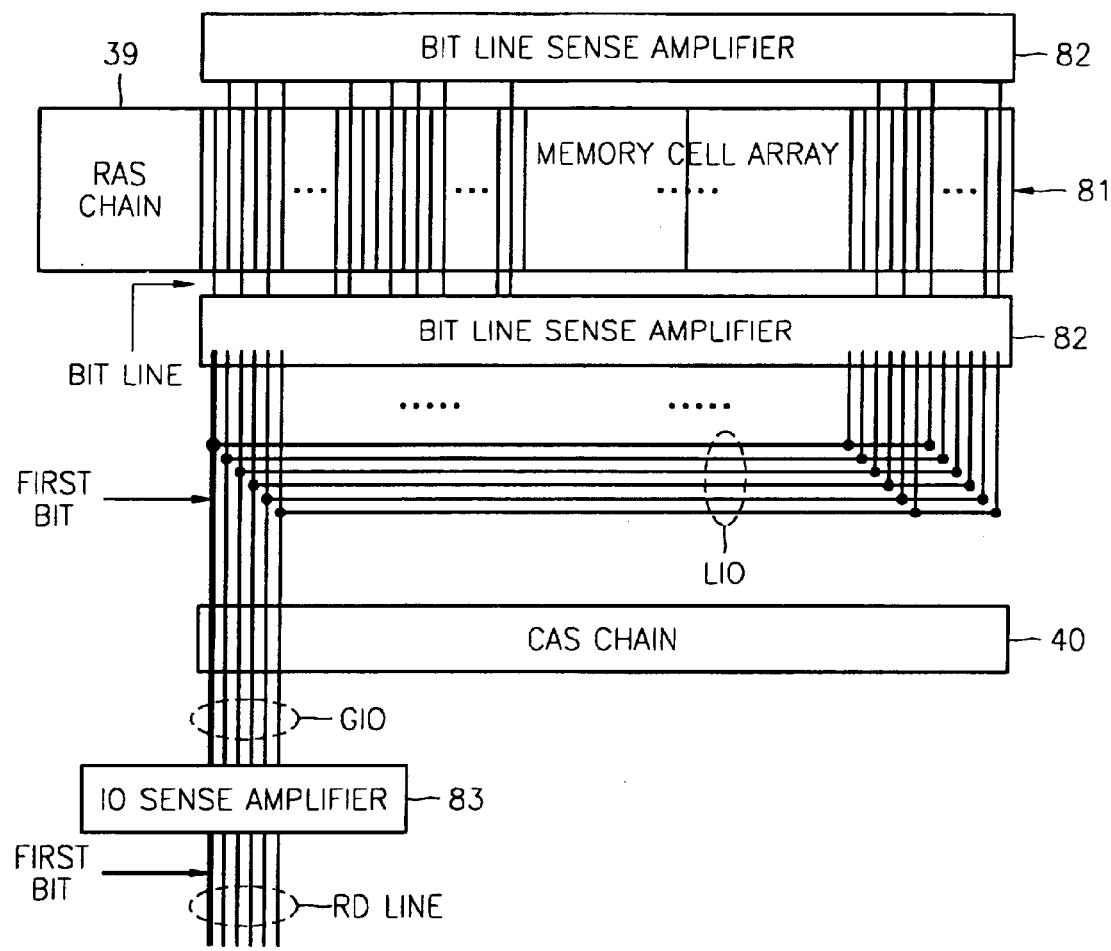
FIG. 9 is a diagram illustrating a fifth embodiment of a structure of a semiconductor memory device which has increased operating speed.

FIG. 9 is a diagram of a semiconductor memory device, according to a fifth embodiment, having a structure which increases the operating speed thereof. Referring to FIG. 9, the semiconductor memory device according to the fifth embodiment includes a RAS chain 39, a CAS chain 40, a plurality of memory cell array blocks 81, bit line sense amplifiers 82, and an input/output (IO) sense amplifier 83. The structures and operations of the RAS chain 39 and the CAS chain 40 are the same as those of the RAS chain 39 and the CAS chain 40 according to the first embodiment, and, thus, their descriptions will be omitted. Also, in FIG. 9, a detailed illustration of the connection between the CAS chain 40 and the bit line sense amplifier 82 is omitted for simplification of the drawing.

Referring to FIG. 9, the two bit line sense amplifiers 82 are positioned in the column direction at the top and bottom of the plurality of memory cell array blocks 81. The bit line sense amplifiers 82 are connected to bit lines of the plurality of memory cell array blocks 81 so as to amplify the data of the memory cells. Also, the CAS chain 40 is placed in the column direction at the bottom of the plurality of memory cell array blocks 81.

A path for outputting data amplified by the bit line sense amplifier 82 will now be described. Data amplified by the bit line sense amplifier 82 is again amplified by the IO sense amplifier 83 via a local IO line (LIO) and a global IO line (GIO). The data output from the IO sense amplifier 83 is transmitted to an output pad (not shown) using a read data (RD) line and then is output to the outside.

As shown in FIG. 9, multi-bit data is output from one memory cell array block. The multi-bit data is converted into serial data and output in the order of a first bit through an $n^{th}$ bit (n is a natural number more than 2). Thus, the output speed of the entire data is determined by the speed of outputting the first bit of data. Thus, an increase in the speed of outputting the first bit of data results in an increase in the speed of outputting the entire data. The speed of outputting the data of the first bit is increased when a path for outputting the first bit of data is effectively shorter than the paths for outputting the next bits of data.

There are many ways of shortening the path of output of the data of the first bit, including: (i) making the size of the bit line sense amplifier 82 connected to a bit line for the first bit larger than those of bit line sense amplifiers connected to bit lines for other bits; (ii) making a space, width, and shielding space of a data path, e.g., LIO/GIO, from the bit line sense amplifier 82 to the IO sense amplifier 83, larger than those of other data paths; and (iii) setting a gain of the IO sense amplifier 83 connected to the GIO for the first bit to be larger than those of other data paths; and (iv) making a layout, such as a line space, width, and coupling, of the RD line of the IO sense amplifier 83 connected to the GIO for the first bit, so that the RD line for the first bit operates faster than RD lines of other bits.

As mentioned above, the IO speed of data can be increased by improving the conditions of the data path of the first bit more than those for the data paths of other bits.

The semiconductor memory device according to the fifth embodiment may be variously constructed from a combination of the semiconductor memory devices according to the first through third embodiments.

As described above, in a semiconductor memory device, having a structure which increases the operating speed thereof, data is input and output in synchronization with an input and output of data to and from the shortest path, thereby increasing the speed of the input/output of data. The semiconductor memory device according to this structure uses one RAS chain and, thus, the size of the semiconductor memory device can be reduced. Further, a repeater that delays and outputs a RAS control signal of each memory array block, is used to decrease a peak current, thereby reducing noise.

What is claimed is:

1. A semiconductor memory device in which a plurality of memory cells are arranged in the form of a matrix in row and column directions, the semiconductor memory device comprising:

a plurality of memory array blocks each including set numbers of memory cells, the memory array blocks being arranged in the row direction;

a Row Address Strobe (RAS) chain aligned at a first side of the plurality of memory array blocks in the row direction, the RAS chain selecting and activating a particular word line;

a Column Address Strobe (CAS) chain aligned at a second side of the plurality of memory array blocks in the column direction, the CAS chain amplifying N bits of data from each of the plurality of memory array blocks and outputting the amplified N bits from each of the memory array blocks to a corresponding input/output (IO) line, wherein N is a natural number more than 2; and a data converter for which sequentially outputs the amplified N bits of data from each of the memory array blocks, beginning with the amplified N bits of data from a memory array block nearest to the RAS chain and subsequently outputting the amplified N bits of data from a memory array block farthest from the RAS chain.

2. The semiconductor memory device of claim 1, wherein:

the plurality of memory array blocks are arranged with respect to the RAS chain in the order of a first memory block, a second memory bock, . . . , and an $M^{th}$ memory array block, so that the first memory array block is nearest to the RAS chain and the $M^{th}$ memory array block is farthest from the RAS chain, and the data converter converts the N bits of data output from each of the first, second, . . . , and the $M^{th}$ memory array blocks into a first bit, a second bit, . . . , an $M^{th}$ bit, respectively, and outputs the result in the order from the first bit to the $M^{th}$ bit.

3. The semiconductor memory device of claim 1, wherein the data converter includes a shift register and performs a multiplexing function.

4. The semiconductor memory device of claim 1, wherein the respective memory array blocks are divided into predetermined numbers of memory sub-blocks.

5. A semiconductor memory device in which a plurality of memory cells are arranged in the form of a matrix in row and column directions, the semiconductor memory device comprising:

a plurality of memory array blocks each including set numbers of memory cells, the memory array blocks being arranged in the row direction;

a Row Address Strobe (RAS) chain aligned at a first side of the plurality of memory array blocks in the row direction, the RAS chain selecting and activating a particular word line;

a Column Address Strobe (CAS) chain aligned at a second side of the plurality of memory array blocks in the column direction, the CAS chain for amplifying N bits of data from the plurality of memory array blocks and outputting the result to an input/output (IO) line, wherein N is a natural number more than 2; and a data converter for continuously outputting the N bits of data input via the IO line from a memory array block nearest to the RAS chain to a memory array block farthest from the RAS chain;

wherein the nearer a memory array block comes to the RAS chain, the greater the number of the memory sub-blocks of the memory array block.

6. A semiconductor memory device in which a plurality of memory cells are arranged in the form of a matrix in row and column directions, the semiconductor memory device comprising:

a plurality of memory array blocks each including set numbers of memory cells, the memory array blocks being arranged in the row direction;

a Row Address Strobe (RAS) chain aligned at a first side of the plurality of memory array blocks in the row direction, the RAS chain selecting and activating a particular word line;

a Column Address Strobe (CAS) chain aligned at a second side of the plurality of memory array blocks in the column direction, the CAS chain for amplifying N bits of data from the plurality of memory array blocks and outputting the result to an input/output (IO) line, wherein N is a natural number more than 2:

a data converter for continuously outputting the N bits of data input via the IO line from a memory array block nearest to the RAS chain to a memory array block farthest from the RAS chain; and one repeater between every two adjacent memory array blocks;

wherein the repeater delays a control signal output from the RAS chain for a predetermined time and outputs the delayed control signal.

7. The semiconductor memory device of claim 1, wherein:

the plurality of memory array blocks further comprise a plurality of redundancy memory array blocks; and each of the plurality of redundancy memory array blocks is arranged to have a data IO path through which data is input and output to be the same as or be faster than those to IO paths of memory array blocks, and the memory array blocks are repaired by the redundancy memory array blocks.

8. The semiconductor memory device of claim 2, wherein an output path of a first bit of the N bits of data is designed to output data faster than paths of output of data of next bits which are continuously output.

9. The semiconductor memory device of claim 4, wherein the memory array block closest to the RAS chain has a greater number of the memory sub-blocks than the memory array block farthest from the RAS chain.

10. A semiconductor memory device in which a plurality of memory cells are arranged in the form of a matrix in row and column directions, the semiconductor memory device comprising:

a plurality of memory array blocks including predetermined numbers of memory cells, the memory array blocks being arranged in the row direction;

a Row Address Strobe (RAS) chain arranged at a first side of the plurality of memory array blocks in the row direction, the RAS chain for selecting and activating a particular word line;

a Column Address Strobe (CAS) chain arranged at a second side of the plurality of memory array blocks in the column direction, the CAS chain amplifying N bits of data output from each of the plurality of memory array blocks and outputting the amplified N bits of data from each of the memory array blocks to a corresponding IO line, wherein N is a natural number more than 2; and a plurality of multiplexers converting the amplified N bits of data from each of the memory array blocks into serial data and outputting the serial data;

wherein the respective memory array blocks are divided into predetermined numbers of memory sub-blocks; and the nearer a memory array block is to the RAS chain, the smaller the number of the memory sub-blocks of the memory array block.

11. The semiconductor memory device of claim 10, wherein the respective memory array blocks output N bits of data at the same point of time.

* * * * *